United States Patent [19]

Kaplan

[11] Patent Number: 5,237,513
[45] Date of Patent: Aug. 17, 1993

[54] OPTIMAL INTEGRATED CIRCUIT GENERATION

[75] Inventor: Jonathan T. Kaplan, New York, N.Y.

[73] Assignee: Massachusetts Institute of Technology, Cambridge, Mass.

[21] Appl. No.: 510,728

[22] Filed: Apr. 18, 1990

Related U.S. Application Data

[63] Continuation-in-part of Ser. No. 439,555, Nov. 20, 1989, abandoned.

[51] Int. Cl.$^5$ .................. G06F 15/60; G06F 7/48
[52] U.S. Cl. ............................. 364/490; 364/489; 364/488; 364/715.01
[58] Field of Search ............... 364/488, 489, 490, 491, 364/715.01, 784; 307/445, 471

[56] References Cited

U.S. PATENT DOCUMENTS

| | | | |
|---|---|---|---|
| 4,541,067 | 9/1985 | Whitaker | 364/716 |
| 4,566,064 | 1/1986 | Whitaker | 364/489 |
| 4,591,993 | 5/1986 | Griffin et al. | 364/491 |
| 4,622,648 | 11/1986 | Whitaker | 364/715 |
| 4,697,241 | 9/1987 | Lani | 364/488 |
| 4,709,226 | 11/1987 | Christopher | 364/715.01 |
| 4,792,909 | 12/1988 | Serlet | 364/491 |
| 4,916,627 | 4/1990 | Hathaway | 364/490 |

OTHER PUBLICATIONS

M. Y. Tsai, "Pass Transistor Networks in MOS Technology: Synthesis, Performance, and Testing," *Proc. of IEEE Conf.*, 1983, pp. 509–512.

O. Ishizuka, "Synthesis of a Pass Transistor Network Applied to Multi-Valued Logic," *Proc. of the 16th EEEE ISMVL*, 1986, pp. 51–57.

O. Ishizuka and J. Xu, "Simplification of Pass Transistor Networks and its Applications," *Proc. of 17th IEEE ISMVL*, 1987, pp. 292–297.

R. K. Brayton and C. McMullen, "The Decomposition and Factorization of Boolean Expression," *IEEE Symposium on Circuits and Systems*, 1982, pp. 49–54.

E. Detjens et al., "Technology Mapping in MIT," *Proc. of IEEE Int'l Conf. on CAD*, 1987, pp. 116–119.

Brayton et al., "MIS: A Multiple-Level Optimization System," *Proc. of Int'l Workshop on Logic Synthesis*, 1987.

W. D. Becher, "Karnaugh Map Minimization," *Logical Design Using Integrated Circuits*, 1977, Hayden Book Co. USA, pp. 93–119.

S. Whitaker, "Pass-Transistor Networks Optimize n-MOS Logic," *Electronics*, pp. 144–148.

R. Brayton et al., "Multiple-Level Logic Optimization System," *IEEE Inter Conf. on CAD*, 1986, pp. 356–359.

*Primary Examiner*—Vincent N. Trans
*Attorney, Agent, or Firm*—Hamilton, Brook, Smith & Reynolds

[57] ABSTRACT

An integrated circuit structure is generated to perform a given combinational logic function. A data processing system generates the integrated circuit structure when provided with an input specification of the function to be performed by the structure. The resulting integrated circuit structure is comprised of both restoring logic networks and pass logic networks. The structure is generated by initially representing the function in a number of multidimensional boolean spaces. Subsequently, these spaces are manipulated to generate the resulting pass and restoring logic networks.

8 Claims, 10 Drawing Sheets

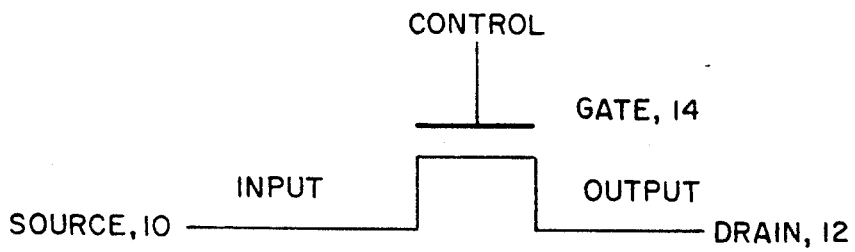
FIG. 1 (PRIOR ART)
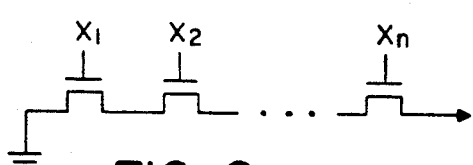
FIG. 2a (PRIOR ART)
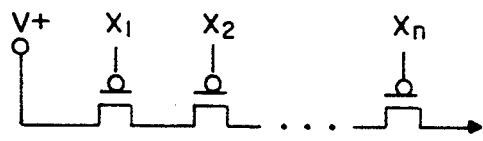
FIG. 2b (PRIOR ART)
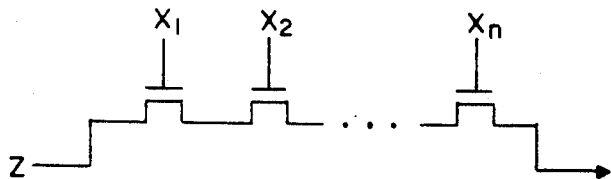
FIG. 2c (PRIOR ART)
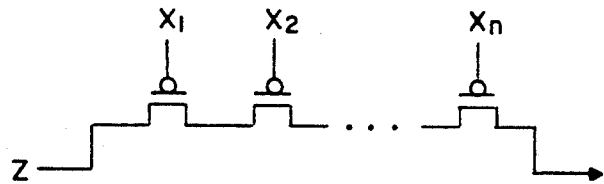
FIG. 2d (PRIOR ART)
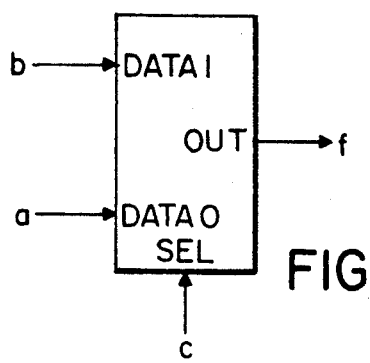
FIG. 3a
FIG. 3b

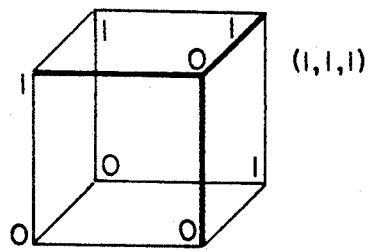
FIG. 4a
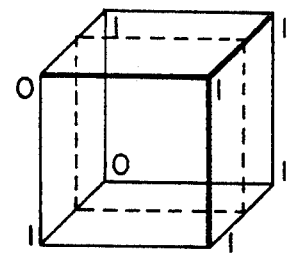
FIG. 4c
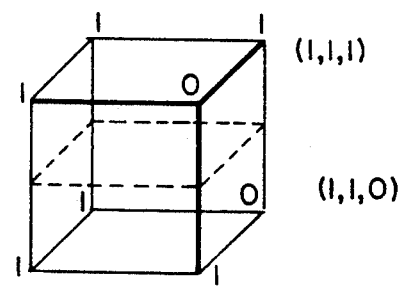
FIG. 4b
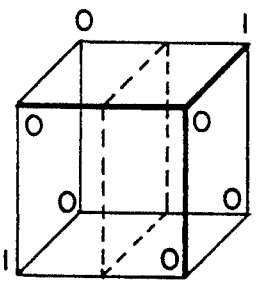
FIG. 4d
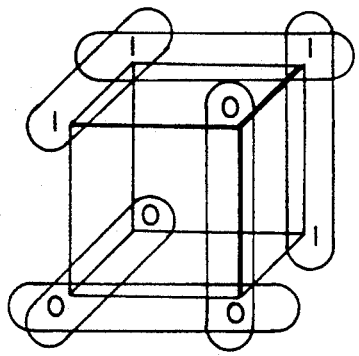
FIG. 5a
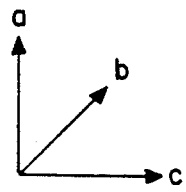
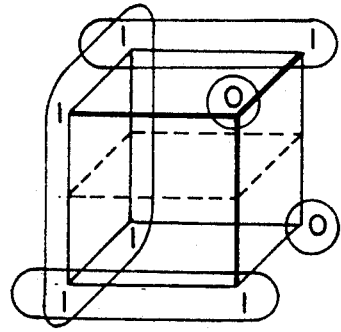
FIG. 5b
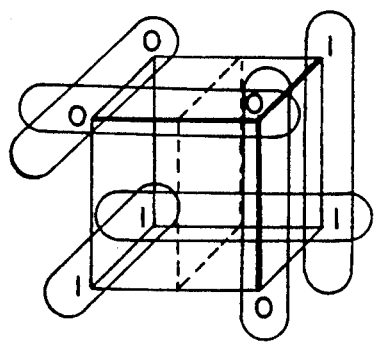
FIG. 5c
FIG. 5d

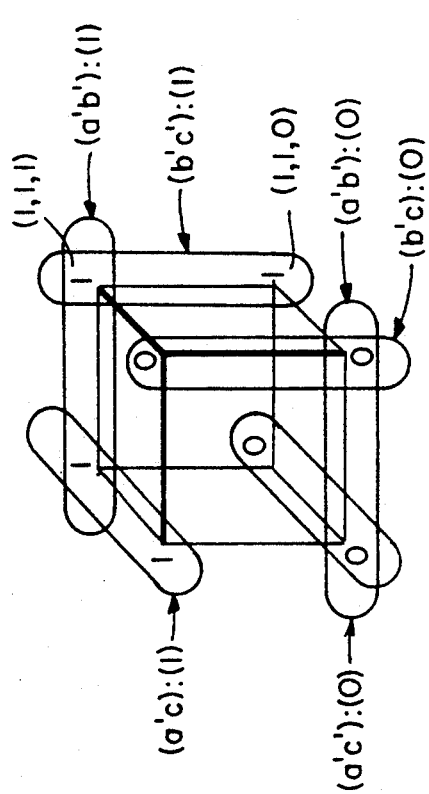
FIG. 7a
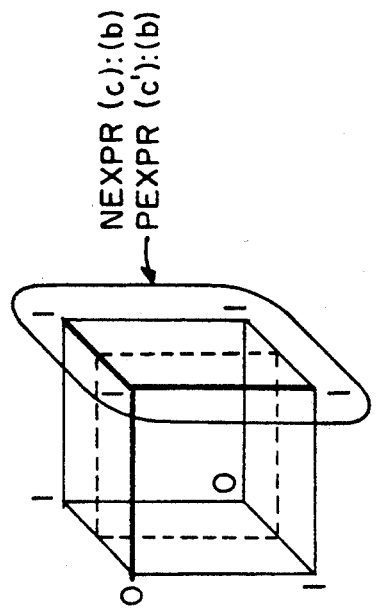
FIG. 7c
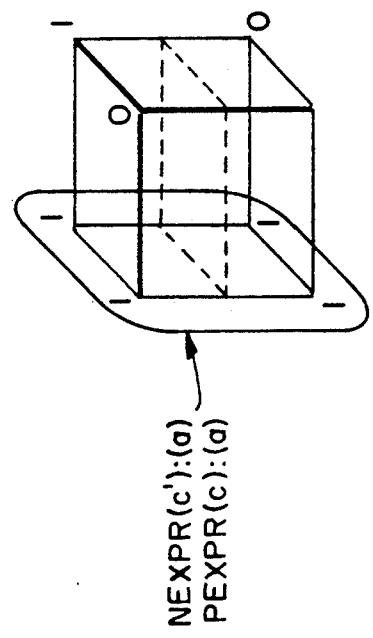
FIG. 7b
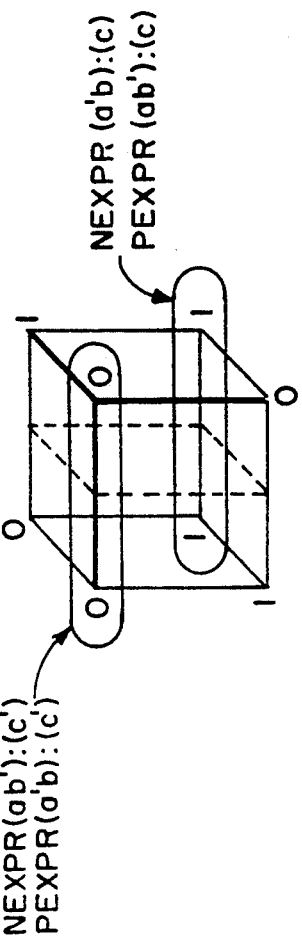
FIG. 7d
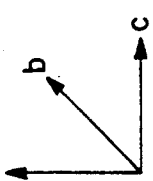

A prime implicant $X_1 - X_2 - \ldots X_n$ covering $1$'s:

NEXPR: $(X_1 - X_2 - \ldots X_n):(Z)$
PEXPR: $(X_1' - X_2' - \ldots X_n'):(Z)$

Input Truth Table:

| b | a | f |
|---|---|---|
| 0 | 0 | 0 |
| 0 | 1 | X |
| 1 | 0 | 1 |
| 1 | X | X |

Gives 4 Possible Truth Tables:

| b | a | f |
|---|---|---|
| 0 | 0 | 0 |
| 0 | 1 | 0 |
| 1 | 0 | 1 |
| 1 | 1 | 0 |

| b | a | f |
|---|---|---|
| 0 | 0 | 0 |
| 0 | 1 | 1 |
| 1 | 0 | 1 |
| 1 | 1 | 0 |

| b | a | f |
|---|---|---|
| 0 | 0 | 0 |
| 0 | 1 | 0 |
| 1 | 0 | 1 |
| 1 | 1 | 1 |

| b | a | f |
|---|---|---|
| 0 | 0 | 0 |
| 0 | 1 | 1 |
| 1 | 0 | 1 |
| 1 | 1 | 1 |

TRANSFORM1:
(X·A):(Z)+(X):((Y ):(Z )+(Y ):(Z )+···(Y ):(Z ))
= (X):((A):(Z)+(Y ):(Z )+(Y ):(Z )+···(Y ):(Z ))

TRANSFORM2:
(X ):(Z)+(X ):(Z)+···(X ):(Z) = (X +X +···X ):(Z)

RULE 8: STEER_VAR    bool_expr

For N network:

STEER_VAR

For P network:

STEER_VAR

RULE 6: bool_expr * bool_expr

RULE 5: bool_expr + bool_expr

OPTIMAL INTEGRATED CIRCUIT GENERATION

RELATED PATENT APPLICATIONS

The present application is a continuation in part of pending U.S. Patent Application entitled "Theoretical Foundations for the Synthesis of Mixed Gate and Their Technology Mapping", Ser. No. 07/439,555 by Jonathan T. Kaplan, filed Nov. 20, 1989; now abandoned.

BACKGROUND OF THE INVENTION

In very large scale integration (VLSI) design, Boolean logic expressions are realized through networks of combinational logic gates. The combinational logic gates come in many varieties including pass logic transistor networks and restoring logic transistor networks. The pass and restoring transistor networks of the combinational logic gates are typically realized as metal on semiconductor field effect transistors (MOSFET).

A schematic of a MOSFET is depicted in FIG. 1. The MOSFET has a source 10, a drain 12 and a gate 14. The gate 14 is coupled to a control signal that dictates whether the input signal passes from the source 10 through the gate 14 to the drain 12 as output. In particular, if the control signal places the gate 14 in a high-impedance state, the input signal does not pass through the gate 14. On the other hand, if the control signal places the gate 14 in a conductive state, the input signal from the source 10 is conducted and passes as an output signal to the drain 12. When employed in this manner, the MOSFET acts as a simple switch.

The MOSFET may be either an N or P type MOSFET. In an N type MOSFET, the substrate is comprised of a P-semiconductor material. When the N type MOSFET conducts, the current carries electrons. With a P type MOSFET, in contrast, the substrate is comprised of N-semiconductor material, and as a result, the current carries holes rather than electrons. A plurality of N MOSFETs coupled together, consistute an N network. Similarly, a plurality of P MOSFETS coupled together form P networks.

Pass logic networks and restoring logic networks may be comprised of both P networks and N networks. The distinction between pass logic networks and restoring logic networks lies in how the networks employ the inputs of the network's combinational logic function. Restoring logic networks employ the inputs to control the gates 14 of the MOSFET's. The source 10 of the MOSFET is tied either high or low, and it is one of these fixed values which is passed from the source 10 to the drain 12 of a MOSFET. This fixed value is passed when the signal applied to the gate 14 puts the transistor in a conducting state. Pass logic networks, however, employ the inputs differently. They employ the inputs as both signals that control the gate 14, and values that are passed from the source 10 to the drain 12.

Example restoring logic networks are shown in FIGS. 2a and 2b. In particular, FIG. 2a shows an N restoring logic network that is tied to a ground (low). The combinational inputs for this network are $X_1, \ldots, X_n$. FIG. 2b shows a similar restoring logic network, but this network is a P restoring network which is tied to a voltage source (high). The combinational inputs $X_1, \ldots, X_n$ are applied as control signals in this network.

FIGS. 2c and 2d depict pass logic networks for a given combinational input Z. In FIG. 2c, an N pass network is shown. FIG. 2d shows a P pass network. Note that all of the control signals are complemented in the P pass network. In both of these pass networks the combinational input Z may assume a value of either 1 or 0.

VLSI designers often desire to use both pass logic networks and restoring logic networks in designing integrated circuits. Currently, however, automated generation of combinational logic has focused exclusively on integrated circuits having only restoring logic networks. As such, if a designer desires to use pass logic networks in his integrated circuit design, he cannot utilize an automated generation approach. This is especially problematic given the significant advantages of including pass logic networks in integrated circuit designs. For instance, pass logic networks (often) generate smaller (and/or faster) integrated circuits. Smaller integrated circuits are cheaper to produce while faster integrated circuits yield higher performance products.

SUMMARY OF THE INVENTION

The present invention concerns an integrated circuit structure that is comprised of pass and restoring logic networks. A data processor is programmed to generate this structure so that it performs a specified function. The integrated circuit structure produced by the data processor is preferably a complimentary metal oxide semiconductor (CMOS) structure. The pass and restoring logic networks of the structure may comprise complimentary N and P transistor networks having multiple inputs.

The data processor that generates this integrated circuit structure is comprised of an input means for receiving a specification of the function to be performed by the integrated circuit. It also includes a processor for receiving the input friction and for generating a schematic description of the circuit appropriate to perform that function. This circuit is (as described above) comprised of both pass logic networks and restoring logic networks. Lastly, an output means is provided in the data processor to output the schematic description of the circuit generated by the processor. The processor is preferably comprised of a plurality of parallel processing units so as to optimize the speed with which complex integrated circuit structures are generated.

The system operates in stepwise fashion. The first step of operation is inputting the function to be performed by the integrated circuit. The function that is input may be input in a variety of different ways, but it is preferred that the function to be input as a characterization of the inputs and corresponding outputs of the function such as a truth table. Once the function has been input, data structures are generated. The data structures are comprised of multi-dimensional spaces that represent the inputs and outputs of the function. A representation of the inputs and outputs is stored within these data structures. There are data structures that view the inputs as pass variables as well as data structures that view the inputs as control variables.

Once the data structures have been generated and the representations have been stored in the data structures, prime implicants are found for the representations. These prime implicants are then examined, and certain ones of the prime implicants are selected to generate the integrated circuit structure. In accordance with one embodiment, the prime implicants are selected by first determining which prime implicants when added to a set of already selected prime implicants create a most efficient partial cover. Initially, this partial cover is empty. Once a prime implicant has been found that creates a most efficient partial cover, the prime implicant is added to the existing partial cover to generate a new partial cover. These steps are repeated until the updated partial cover covers the function. Efficiency is preferably determined by examining the number of vertices covered by a partial cover ad dividing that amount by the number of transistors required to implement the partial cover. It is also preferred that if more than one prime implicant generates equally efficient new partial covers that the system operate recursively on each of the new partial covers to find an ultimately most efficient new partial cover. Once the appropriate set of prime implicants are selected, the schematic description of the integrated circuit is generated in a straightforward fashion.

The data structure that views inputs of the function as control variables is comprised of a plurality of nodes. Each of these nodes has coordinates corresponding to values of inputs of the function. Moreover, each said node has a value equal to an output of the function when the values of the inputs are applied to the function.

Another data structure holds a representation of the function wherein an input is viewed as a pass variable. There is one such data structure for each input. For each such data structure, there are a plurality of nodes. The coordinates for the nodes correspond to values of inputs of the function as they do in the other data structures. The values, however, are different from the previously described variety of data structures. If a node of the data structure has a value of one, it implies that the output of the function is equal to the value of the single input which is viewed as a pass variable. In contrast, if the node has a value of zero, it implies that the output of the function is not equal to the value of the single input which is viewed as a pass variable. Considered collectively, the data structure that views the inputs of the function as control variables, and the data structures that view the inputs of the function as pass variables constitute an optimization space in which the optimal subset of prime implicants which completely cover the function is found.

In addition to the data structures, the present invention relates on an expression format for symbolically representing a combinational logic network. This expression format is first comprised of a boolean expression field. This field expresses the control variables which control output of the pass variable. The expression also includes a pass variable field denoting a value that is allowed to pass as output if the boolean expression has a value of one. In contrast, if the boolean expression has a value of zero, the value is not allowed to pass as output. A delimiter separates the boolean expression field from the pass variable field. In the preferred embodiment, the delimiter comprises a colon.

The present invention has the capability of handling "don't care" conditions. In particular, it has the ability of handling a combination of inputs that will never be applied to the integrated circuit structure (i.e. N type "don't care" conditions). Such input combinations are flagged when the representation of the function is stored in the data structures. Later when the prime implicants of the representations are found, the outputs of these flagged combinations are considered as both ones and zeros. Moreover, when the set of prime implicants are selected the nodes flagged as "don't care" nodes do not need to be covered in order for the selected set of prime implicants to constitute a complete cover.

The present invention can also accomodate "don't care" conditions wherein the inputs may assume a value of either zero or one (i.e. X type "don't care" conditions). Given i nodes of exhibiting X type "don't care" conditions in the input truth table, $2^i$ truth tables are generated in which all possible combinations of assignments of 1 and 0 values to the X type nodes are represented. Each of the $2^i$ truth tables is then separately run through the mixed gate generation algorithm. The truth table which produces the cheapest mixed gate (i.e. a gate that combines pass and restoring transistor networks) is taken as the solution for the original truth table which contains X nodes.

BRIEF DESCRIPTION OF THE DRAWINGS

FIG. 1 depicts a schematic of a MOSFET.

FIGS. 2a and 2b depict restoring logic networks.

FIG. 3a depicts the truth table for the 2MUX function.

FIG. 3b depicts the logic symbol for the 2MUX function.

FIGS. 4a, 4b, 4c and 4d depict the 3-spaces of the optimization space for the 2MUX function.

FIGS. 5a, 5b, 5c and 5d depict the prime implicants of the 3-spaces for the 2MUX function.

FIGS. 7a, 7b, 7c and 7d depict the pass expressions for the prime implicants of the 2MUX function.

DETAILED DESCRIPTION OF THE PREFERRED EMBODIMENTS

Figure 6C:
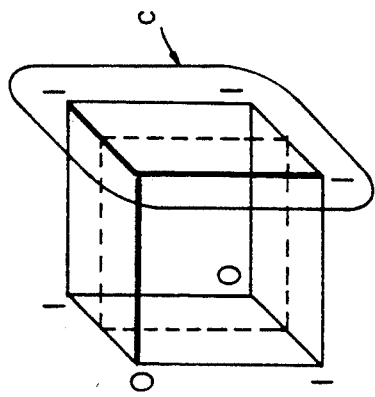
FIGS. 6a, 6b, 6c and 6d depict the non-redundant prime implicants of the 3-spaces of the 2MUX function.
Figure 6D:
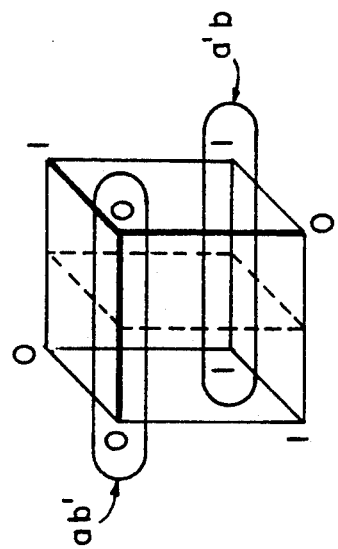
Figure 6A:
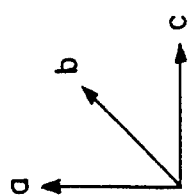
Figure 6A:
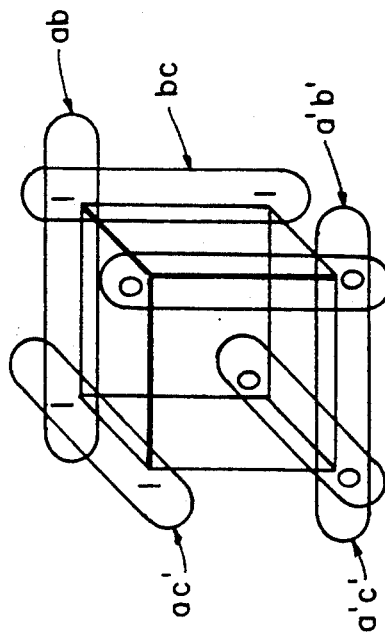

The present invention broadens the class of integrated circuits that can be designed algorithmically. In particular, it expands the class of circuits which can be designed algorithmically to include gates that utilize both pass logic networks and restoring logic networks. By combining both of these types of networks, the present invention vastly expands the range of integrated circuit designs available to a designer. Since the process is performed algorithmically, the designer can work with a higher level description than if he were forced to proceed manually. As a result, the designer need not become unnecessarily involved with trivial details of the design; rather, he can focus on the important higher level issues. The present invention, hence, provides an approach that is less complex to the designer, and accordingly, less prone to design error.

The system operates by receiving as input a specification of the function to be performed by the integrated circuit structure. The function may be input into the data processing system in a variety of different formats. In the preferred format, the function is input as a truth table. A truth table lists the inputs of the function and the corresponding outputs of the function produced in response to the inputs. An examples truth table for a 2MUX function is shown in FIG. 3a. A logical symbolic representation of this function is shown in FIG. 3b. In general, for the 2MUX function the input "c" acts as a select to select either the input "a" or the input "b".

It should be appreciated, however, that the scope of the present invention is not limited to inputting the description of the function as a truth table. An equally viable alternative is for the function to be specified as a karnaugh map (K-map) or to be specified in another alternative format. In general, what is required is a representation of the function in terms of its inputs and outputs. Once such a description of the function is provided to the data processing system, programs held within the system analyze the description and produce an integrated circuit structure design that performs the function.

The first step in analyzing the input is to map the function into an optimization space. The optimization space is a plurality of boolean N-spaces which are represented as data structures within the system. The boolean N-spaces are N dimensional spaces having a plurality of vertices (sometimes referred to as nodes). The system is able to generate an optimal plurality of pass logic networks and restoring logic networks from the optimization space. The optimization space is comprised of N+1 boolean N-spaces for an N-input function. Thus, if there are three inputs, such as in the 2MUX function, the N-spaces are three dimensional spaces. From the above statement, it also follows that if there are three inputs to the functions, then, there are four boolean three spaces for that function. Amongst these N+1 boolean N-spaces, one of the N-spaces views the inputs as control signals for a restoring logic network. The N space is utilized by the system to generate the restoring logic networks. The remaining N-spaces view the inputs as pass values. A separate N-space is created for each input. These N-spaces are utilized to generate the pass logic networks.

For purpose of distinguishing the one N space that views the inputs as control signals from the other N-spaces, the one N-space that views the inputs as control signals is referred to as the CONSTANT space. It is referred to as the CONSTANT space because it represents restoring logic networks that pass only constant values of either one or zero. The other remaining N-spaces are referred to by the particular input variable which they view as a pass value. For the 2MUX example, the boolean N-space that views the input variable "a" as a pass value (shown in FIG. 4b) is denoted as the a-space.

As mentioned above, all of these spaces are N-dimensional boolean spaces. For a function F having inputs $A_1, A_2, \ldots, A_n$, a dimension is assigned to each of the n inputs (note that n=N). As also mentioned previously, the boolean N-spaces are comprised of a plurality of vertices or nodes. Each vertex in the N-space is reference by its coordinates. The coordinates for any vertex are the corresponding inputs for that vertex. As such, each set of inputs written as $(A_1, A_2, \ldots, A_n)$ becomes the address of a unique vertex in a boolean N-space.

FIGS. 4a, 4b, 4c and 4d illustrate sample boolean 3-spaces for the 2MUX function (see the truth table in FIG. 3a). In particular, FIG. 4a shows the boolean 3-space that comprises the CONSTANT 3-space for the 2MUX function. The values of each of the vertices in this space is the output produced for the combination of inputs that are the coordinates of that vertex. For instance, the output produced when all of the inputs are one also has a value of one. This vertex is denoted in FIG. 4a by its coordinates (1, 1, 1) (where the vectors are ordered as (c, b, a) to follow the truth table for the 2MUX function in FIG. 3a). The value can be checked by referring to the last line of the truth table depicted in FIG. 3a, which indicates that if all the inputs are one, the output of the function is, likewise, one.

The remaining 3-spaces depicted in FIGS. 4b, 4c and 4d are the 3-spaces that consider the inputs as pass values. FIG. 4b depicts input "a" as a pass value, FIG. 4c depicts input "b" as a pass value and lastly, FIG. 4c depicts input "c" as a pass value. Each of these figures includes a plane that is shown in phantom form. This phantom plane serves as a dividing boundary between the two possible values that the pass value input may assume. For example, in FIG. 4b the phantom plane divides the possible values of input "a" which may be either zero or one. Similarly, in FIGS. 4c and 4d the phantom planes divide the values of input "b" and input "c", respectively.

The values at the vertices in the 3-spaces of FIGS. 4b, 4c and 4d are determined by whether the value of the input viewed as a pass value or the compliment of the value of the input has to be passed to produce the appropriate output. If the value of the input has to be passed, then a one is put as the value of the vertex. In contrast, if the value of the compliment of the input has to be passed, a zero is put as the value of the vertex. To aid in clarifying this point, it is helpful to refer to the truth table depicted in FIG. 3a. The vertex at (1, 1, 1) in FIG. 4b has a value of one. By referring to the truth table in FIG. 3a, it can be seen that the output produced for these inputs is one (as discussed above with respect to the CONSTANT space). Hence, the value of input "a" has to be passed to produce the corresponding output and therefore, a value of one is at that vertex. On the other hand, if one examines the value of vertex (1, 1, 0) as shown in FIG. 4b, a value of zero is found. The value is zero for this vertex because the compliment of input "a", as opposed to the noncomplimented value of input "a", has to be passed to produce the proper output.

There are several motivations for the creation of these multiple data structures that represent the function as boolean N-spaces. A primary motivation is that this representation proves especially useful in reducing the function (e.g., the 2MUX function) to an optimal form. Moreover, this representation is convenient for generating the two distinct types of logic networks used by the present invention.

Once the boolean N-spaces are constructed, the prime implicants are found for the boolean N-spaces using the Quine-McCluskey method. The Quine-McCluskey method is well known in the prior art and is described, for instance, in W. D. Becher, *Logical Design Using Integrated Circuits*, 1977. The Quine-McCluskey algorithm is utilized separately for each of the N-spaces to produce a set of prime implicants for each N-space. FIGS. 5a, 5b, 5c, and 5d show the prime implicants for the 2MUX function as derived using the Quine-McCluskey algorithm.

The Quine-McCluskey (QM) algorithm is an orderly way of producing the prime implicants. It initially begins with each individual node in a boolean N-space being as implicant. The QM algorithm then "grows" the prime implicants by the operations of consensus and subsumption, where consensus refers to the operation by which two small implicants are merged to create a larger single implicant. Once a larger implicant is created by consensus, the algorithm checks to see if the new implicant subsumes, or contains, any other implicants. When the QM algorithm stops, the algorithm has found a set of largest implicants which are not contained, or redundant, with respect to each other. These largest implicants are the prime implicants.

There is one twist in the approach adopted by the present invention that differs from a straightforward application of the Quine-McCluskey approach. In the present approach, redundant prime implicants are removed in finding the set of prime implicants for each N-space. Specifically, prime implicants in the N-spaces that view inputs as pass values are examined to determine whether they span both of the values that the pass variable may assume. If the prime implicants do not span both of the variable's values, they are redundant and are covered by other prime implicants.

Figure 6B:
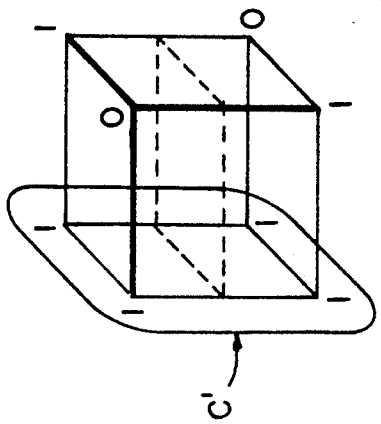

FIGS. 5a, 5b, 5c and 5d provide a good illustration of the redundancy of prime implicants in the three N-spaces that view inputs as pass values. For instance, in FIG. 5b all of the prime implicants that do not span the plane shown in phantom form are redundant to prime implicants of the CONSTANT space depicted in FIG. 5a. Similarly, there are redundant prime implicants in FIG. 5c and 5d. FIGS. 6a, 6b, 6c and 6d show the prime implicants that remain after the redundant prime implicants are struck. These prime implicants are labelled with their corresponding boolean expressions. As can be seen in FIG. 6b, the sole remaining prime implicant is labelled "c'".

Figure 13:
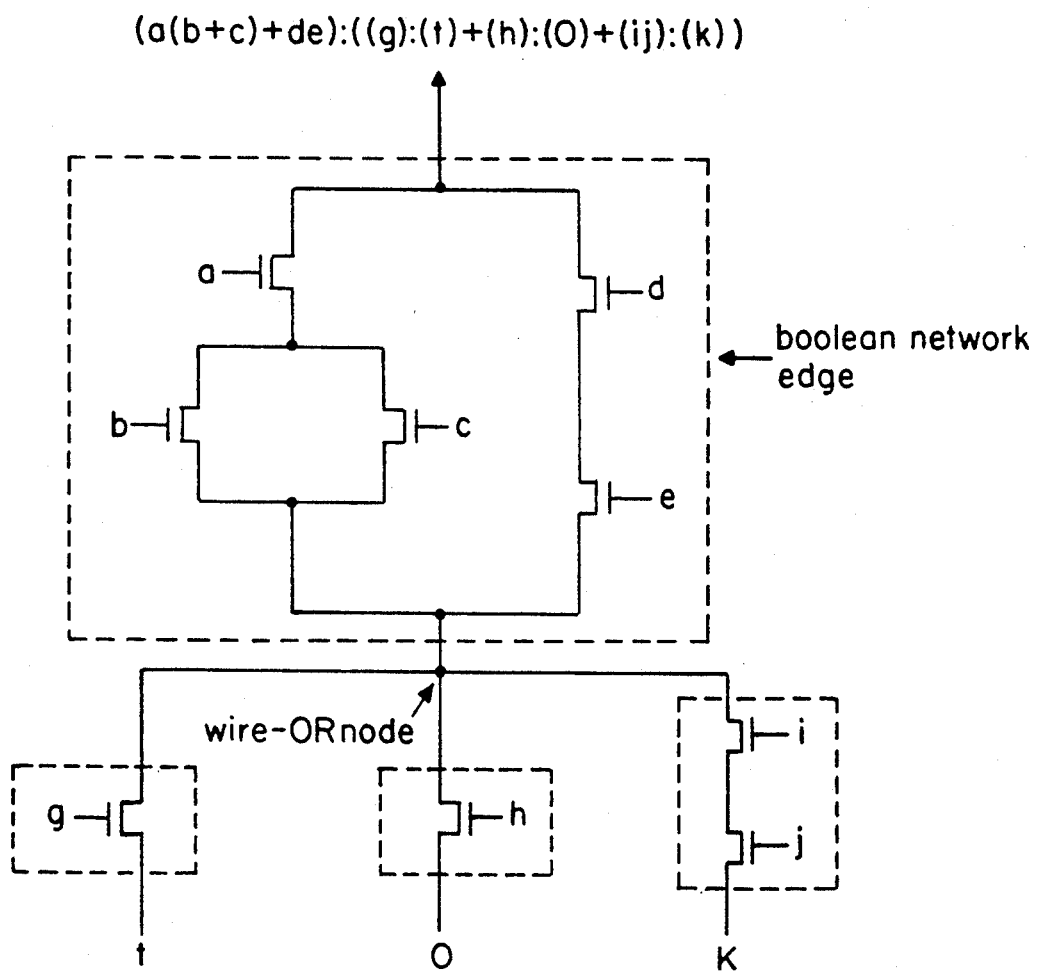
FIG. 13 shows an example pass expression and the N network corresponding with the example pass expression.

The system represents the prime implicants utilizing symbolic notations referred to as pass expressions. Table I depicts the grammar utilized for pass expressions. As depicted in Table I, a pass expression may comprise a disjunction of two or more different pass expressions. It may also comprise a boolean expression separated by a color from another pass expression. The colon acts as a delimiter between the two parts of the expression. In particular, the colon separates the right-hand side of the expression which constitutes the values to be passed from the left-hand side of the expression which determines whether the value will be passed. A pass expression may also take the form of a boolean expression separated by a colon from a pass variable as opposed to being separated from another pass expression. The colon, however, still retains the same significance. As shown at the bottom of Table I, a pass variable is an element of a set comprised of the inputs of the function unioned with the compliment of the inputs further unioned with the value of one or zero (depending on whether the pass expression is an N or P type pass expression). The utility of utilizing this type of notation is that it helps gather the control signals together in a single boolean expression so that they can be optimized. The semantics of the grammar of Table I, in terms of transistor networks is defined in FIGS. 12a-12f. Further, an example pass network and the N transistor network to which it parses is shown in FIG. 13.

TABLE I

1. Start→pass_expr
2. pass_expr→pass_expr + pass_expr
3. |(bool_expr):(pass_expr)
4. |(bool_expr):(PASS_VAR)
5. bool_expr→bool_expr + bool_expr TABLE I-continued 6. |bool_expr * bool_expr
7. |(bool_expr)
8. |STEER_VAR The pass expression for a function $f(a_1,a_2,...a_n)$ has:
INPUTS={$a_1,a_2,...a_n$}
INV_INPUTS={$a'_1,a'_2,...a'_n$}
STEER_VAR $\epsilon$ INPUTS ∪ INV_INPUTS
For N pass expression:
PASS_VAR $\epsilon$ INPUTS ∪ INV_INPUTS ∪ {0}
For P pass expression:
PASS_VAR $\epsilon$ INPUTS ∪ INV_INPUTS ∪ {0}

The pass expressions for the prime implicants depicted in FIGS. 6a, 6b, 6c and 6d for the 2MUX function are shown in FIGS. 7a, 7b, 7c and 7d, respectively. All of the pass expressions are expressed in the format of a boolean equation separated by a colon from either a CONSTANT value or an input value that is a pass variable. These expressions are examples of pass expressions taken from the grammar shown in Table I. For instance, in FIG. 7a, the prime implicant that spans the vertices at (1,1,0) and (1,1,1) is represented as a pass expression (b'c'):(1). This implies that a value of a one will be passed when both "b" and "c" are one.

It should be noted that for each prime implicant shown in the 3-spaces of FIGS. 7b, 7c and 7d there is both an N pass expression and a P pass expression. These pass expressions are referred to as NEXPR and PEXPR, respectively, in those figures. Separate N and P pass expressions are required for these boolean 3-spaces because the pass variable (e.g. "a" for the prime implicant shown in FIG. 7b) may assume a value of either one or zero.

Having determined the prime implicants and the pass expressions for the prime implicants, the system then directs its attention to finding an optimal combination of these prime implicants that can be used to form the integrated circuit structure. The system utilizes two primary data structures to assist it in its tasks of finding the optimal set of prime implicants. The first of these data structures is created for each prime implicant. This data structure is referred to as PRIME. It has several fields including the NEXPR field which contains the pass expression for the N logic network of the prime implicant. Conversely, PRIME also includes the field PEXPR which contains the pass expression for the P logic network of the prime implicant. Additionally, a field denoted as COV is provided in PRIME. COV is a vector describing nodes that are covered by the prime implicant. The resulting set of PRIME data structures for the 2MUX function is shown in Table II.

TABLE II

| PRIME.NEXPR | PRIME.PEXPR | PRIME.COV |
|---|---|---|
|  | (a'c):(1) | [01010000] |
|  | (a'b):(1) | [00010001] |
|  | (b'c'):(1) | [00000011] |
| (a'c):(0) |  | [10100000] |
| (a'b'):(0) |  | [10001000] |
| (b'c):(0) |  | [00001100] |
| (c'):(a) | (c):(a) | [11110000] |
| (c):(b) | (c'):(b) | [00001111] |
| (ab'):(c') | (a'b):(c') | [01000100] |
| (a'b):(c) | (ab'):(c) | [00100010] |

The second data structure denoted as COVER is utilized in generating a cover of the function that the integrated circuit structure performs. IN general, COVER contains a list of all prime implicants that have been added to the cover. COVER, like the PRIME data structure, has several fields which are NPRIMES, PPRIMES, NFACT, PFACT and COV. The NPRIMES field contains all of the NEXPR expressions that have been added to the cover. Likewise, PPRIMES contains all the PEXPR expressions that have been added to the cover. Two other fields, NFACT and PFACT, are used to hold, in minimzed factored form, the N pass expressions and P pass expressions added to COVER. Lastly, a field denoted as COV is included. It comprises a vector describing the nodes that are covered by the prime implicants held in COVER.

The present invention selects a subset of the prime implicants that completely covers the function with minimal cost. As mentioned previously, it does this with the assistance of the above described data structures. A complete cover of the function is achieved when the PRIME implicants added to COVER include vertices for every combination of inputs which requires an output. Any effort to guarantee that a complete cover of the function is of minimal cost poses a non-polynomial time problem. As a result, the present system adopts a greedy heuristic.

The greedy algorithm seeks to build an optimal cover from the prime implicants that have been previously found using the Quine-McCluskey algorithm. The goal of the selection procedure described here is to select a subset of the prime implicants which completely covers the function. A set of prime implicants completely covers the function when it generates the correct output value for very combination of inputs which are applied to it. A set of prime implicants which does not generate the correct output value for every combination of inputs is called a partial cover. The selection procedure described herein begins with a partial cover which contains no prime implicants. One at at time, every prime implicant which is not already in the partial cover is added to the partial cover. Since the selection procedure begins with an empty partial cover, initially the selection algorithm generates a separate partial cover for every prime implicant which contains only the given prime implicant. Each of these single prime implicant partial covers is rated by efficiency, and the most efficient partial cover is selected. Note, however, that there may be more than one most efficient partial cover. For each most efficient partial cover the selection procedure recurses. The selection procedure recurses by applying the same selection procedure described above for the initially empty partial cover. Every branch of the recursive search is employed until multiple complete covers of the function are produced. The complete cover which is most efficient is used to implement the function as a circuit. If there is more than one most efficient complete cover, then any one of these most efficient solutions may be used to implement the function.

Figures 8, 11:
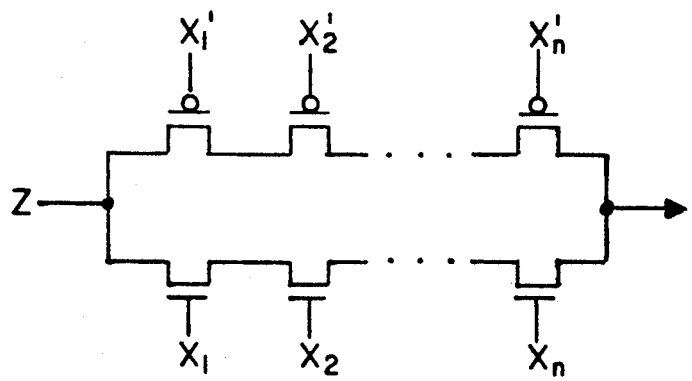
FIG. 8 depicts an exemplary pass logic network.
FIG. 11 depicts and example of the truth tables analyzed for X don't care conditions.

How the pass expressions are implemented in hardware is depicted in FIG. 8 for a pass logic network. In particular, if the N expression and P expression for the prime implicant are as denoted at the bottom of FIG. 8, a transistor network is implemented as a complimentary N transistor network and P transistor network as shown in FIG. 8. Specifically, input Z acts as a pass variable. The remaining X and X' variables act as control signals that determine whether the value of Z is passed to the output or not. To implement an N pass expression, a network similar to the bottom half of the network shown in FIG. 8 is used. Similarly, if a P pass expression is to be constructed, a format similar to the the upper half of the network of FIG. 8 is used. The prime implicants taken from the CONSTANT space are implemented in a much more straightforward manner. The prime implicants having a pass expression that passes a zero are like those shown in FIG. 2a, and the prime implicants having pass expressions that pass one have transistor networks like that shown in FIG. 2b.

The major procedures utilized to generate the cover are listed in C-like code in attached Appendix A. The main procedure is called "greedy-select". "greedy-select" utilizes two other major procedures: one procedure (referred to as "combine") combines a remaining prime implicant with the existing partial cover to produce a new partial cover and another procedure (called "get_tran_count") generates the transistor count for this new partial cover. Of particular interest is the "combine" procedure that adds a prime implicant to the partial cover. This procedure operates in three main steps. In the first step, "combine" checks to see if the prime implicant is contained in the partial cover. It also checks to see if the partial cover is contained in the prime implicant. If either are contained within the other, the prime implicant is redundant and, thus, the next prime implicant is examined.

In the second step, "combine" checks to see whether the prime implicant adds in both its N network and its P network to the cover. If the prime implicant is in the CONSTANT space, it contains only either a P network or an N network. On the other hand, if the prime implicant is from a pass variable N-space, the steps for this determination are more complex. For those instances, if the prime implicant adds at least one zero polarity vertex (i.e. the prime implicant includes a vertex that has a value of zero in the CONSTANT space), the N network of the prime implicant must be added. Similarly, if the prime implicant adds at least a single one polarity vertex (i.e. the prime implicant includes a vertex that has a value of one), the prime implicant must be added to the N network. These prime implicants are added utilizing the data structures previously described. For instance, if the prime implicant is added to the N network, then NEXPR is added to the NPRIMES list. Analogously, if a prime implicant is added to the P network, the PEXPR of the prime implicant is added to the cover's PPRIMES list.

Figure 9A:
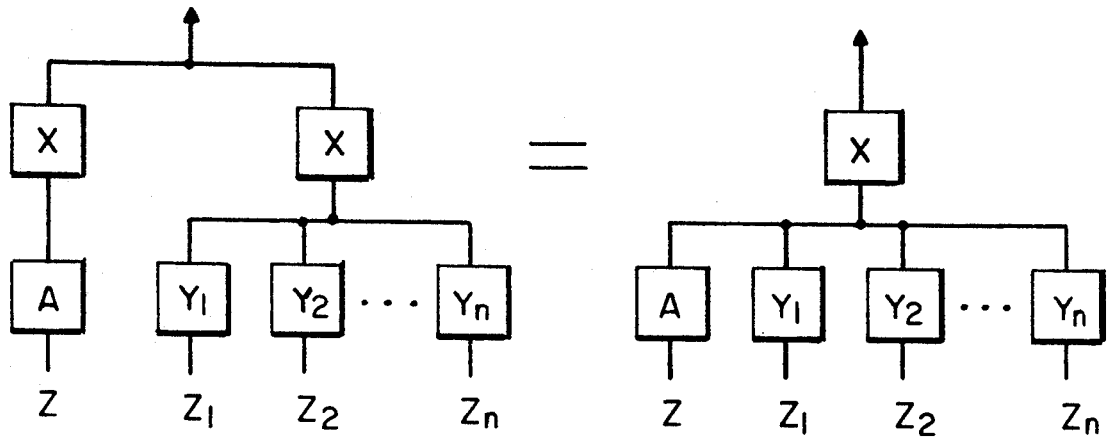
FIGS. 9a and 9b depict examples of the transforms performed by the greedy prime implicant selection algorithm.
Figure 9B:
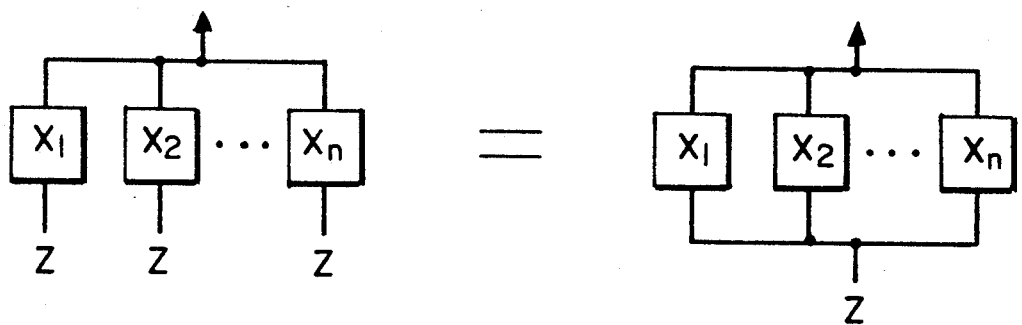
Figure 10:
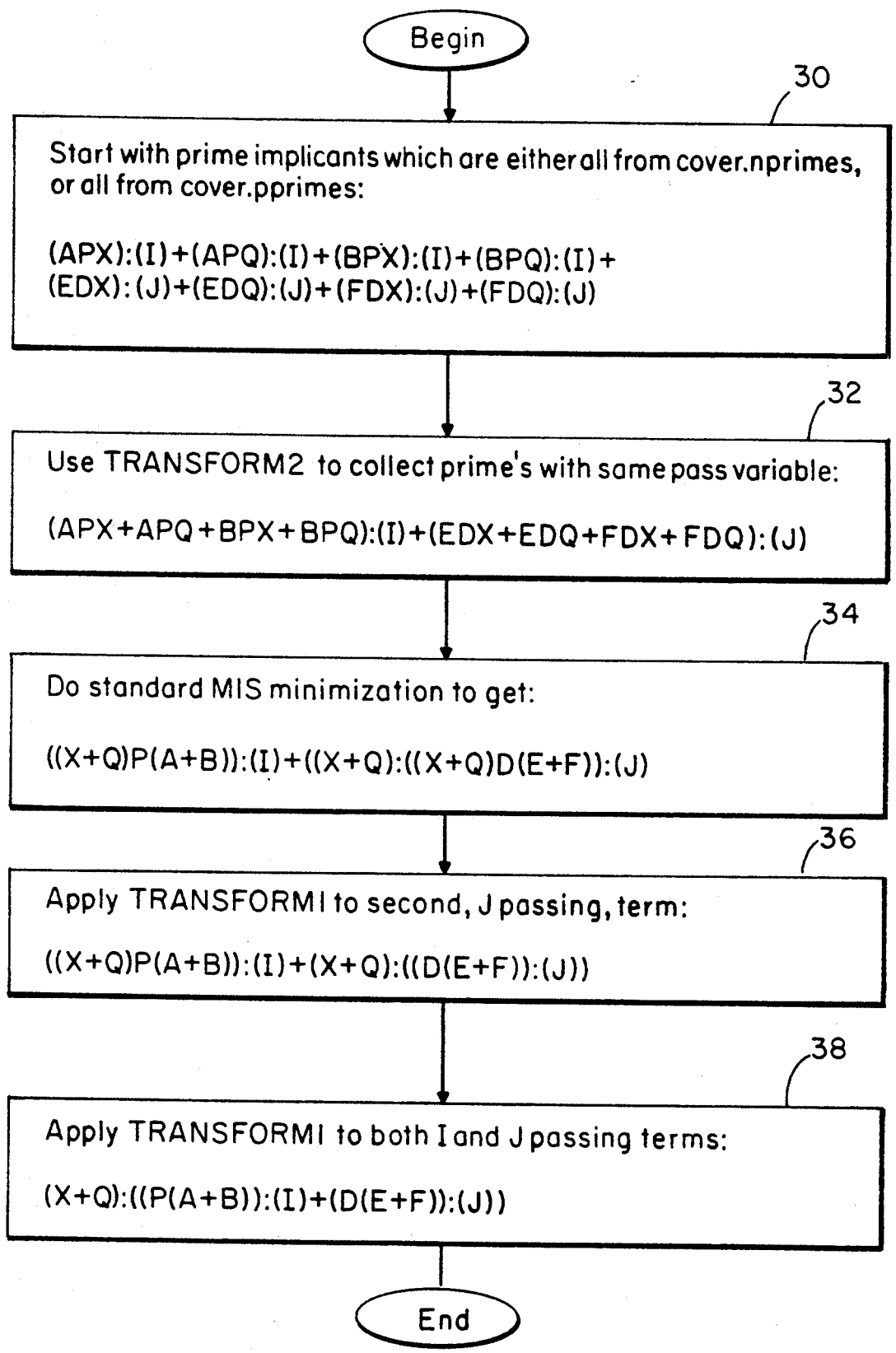
FIG. 10 depicts a flow chart of how the transforms are applied to the greedy selection algorithm.
Figure 12A:
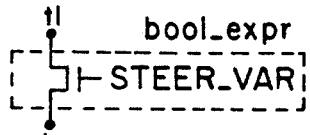
FIGS. 12a–12f illustrate how the grammar translates a pass expression into a circuit.
Figure 12A:
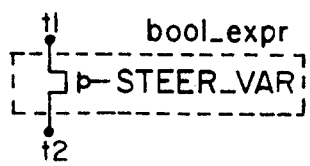
Figure 12B:
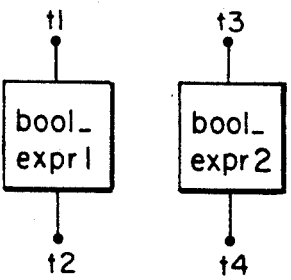
Figure 12B:
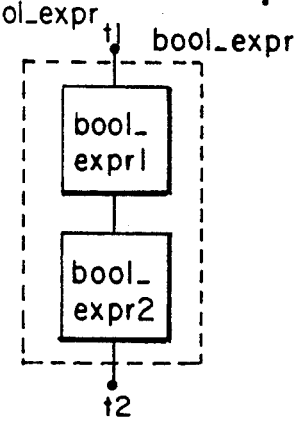
Figure 12C:
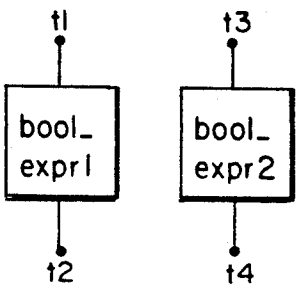
Figure 12C:
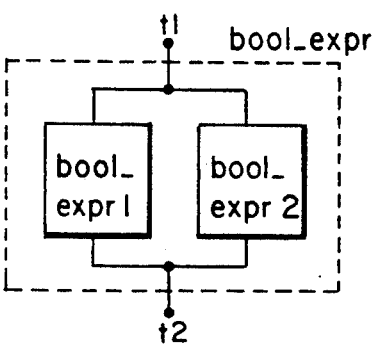
Figure 12D:
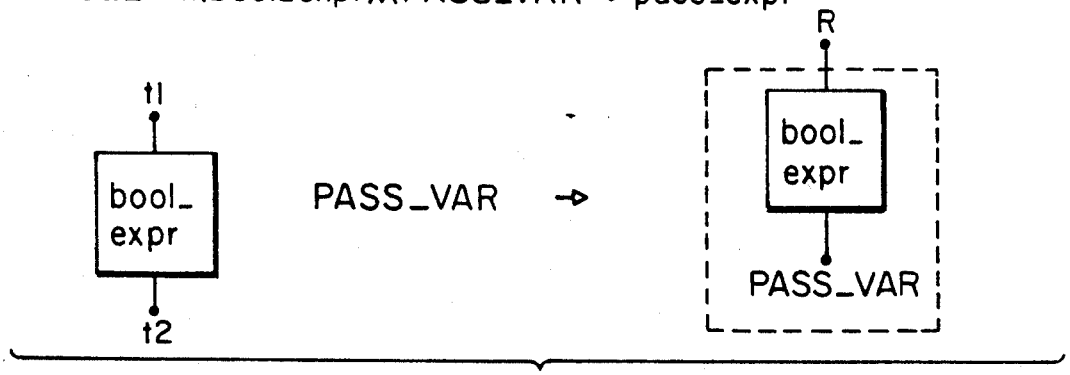
Figure 12E:
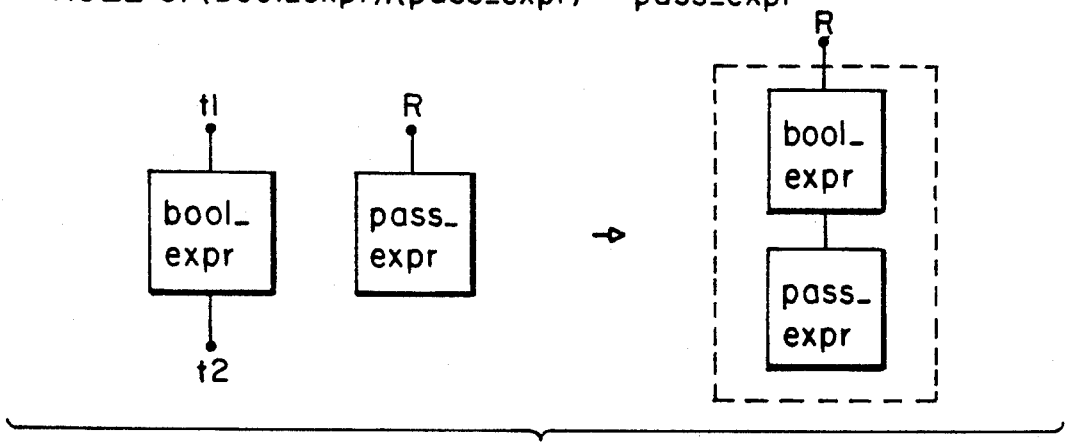
Figure 12F:
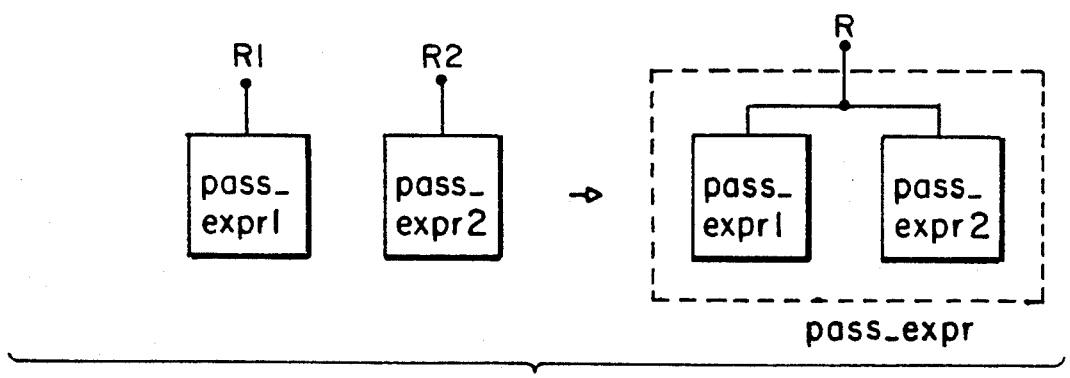

Once the second step is completed, a multi-level logic minimization of the pass expressions in COVER's NPRIMES AND PRIMES lists is performed. Two transformations are used in minimizing the pass expressions. These transformations are depicted graphically with example cases in FIGS. 9a and 9b. The general strategy for employing these transformations is shown in the flowchart of FIG. 10. In accordance with this strategy, the process begins with a set of prime implicants that are either all from COVER.NPRIMES or all from COVER.PPRIMES (Box 30). The first step utilized to perform the minimization is to perform transform2 first (Box 32). Transform2 combines into a single boolean expression all of the boolean expressions of all pass expressions that share the same pass value. The operation of transform2 is illustrated in FIG. 9b. Once transform2 has been performed, standard multi-level logic minimization, as described in *Design Systems for VLSI Circuits*, edited by G. DeMicheli, A. Sangiovanni-Vincentelli and P. Antognetti by Martinns Nijhoff Publishers (1987) 197-248, is performed (Box 34). Next, transform1 is applied (Boxes 36 and 38) to introduce more wired OR nodes below the pass network's root. Thus, as shown in the example of FIG. 9a, X becomes the root of the pass network with a wired OR to A, $Y_1$, $Y_2$, and $Y_n$.

The other major procedure utilized in finding the best partial cover (i.e., "get_tran_count") is one that determines the number of transistors needed to implement the pass expressions of a cover. This procedure like "combine" operates in three steps. First, it counts the number of transistors in the N and P steering networks. "get_tran_count" does this by counting up the total number of literals appearing in every boolean expression in the N expressions and P expressions which were factorized by "Combine" and are in COVER's NFACT and PFACT. Second, it counts the number of inverters needed to produce the inverted control signals (i.e. inverted control variables). This procedure makes the assumption that one inverter can provide an inverted signal to as many transistors as necessary. Third, the number of "half inverters" is counted. An inverter is considered as two independent N and P halves when the inverter is only supplying an inverted pass variable, and not a control signal to a gate. When an inverter is used only to drive a pass variable, the drains of the inverter's N and P transistors need not be connected together. The N transistor of the inverter only drives the NFACT network, while the P transistor only drives the PFACT network. Notice, for example, that if the PRIME which uses the half inverters adds only to the COVER's PPRIMES list, only a single P transistor is needed to provide the inverted pass variable. This is why the number of N "half inverters" is counted separately from the number of P "half inverters".

The major code sections required to implement the present system are shown in Appendix A. The detailed specifics of the code are left to this appendix. It should be appreciated, however, by those skilled in the art that many alternative implementations of the code sections are possible. The present invention is intended to embody all such alternative implementations.

A unique feature of the present invention that has not been discussed thus far is its ability to handle "don't care" conditions. There are two types of "don't care" condition that are readily handled by the present invention. The first type is referred to as an N type "don't care" condition. This type of "don't care" condition specifies a combination of inputs which will never be applied to the circuit for the environment in which it is put to use. The second type of "don't care" condition is referred to as an X type "don't care" condition. It specifies a combination of inputs under which the function's output can be either a one or a zero.

For the present invention to properly handle N type don't care conditions, several changes are necessary. Specifically, the mapping of the truth table to the optimization space is changed to incorporate a combination of which is specified as N. In other words, the corresponding vertices in the CONSTANT space and in each of the pass variable spaces are set to N. An additional change concerns finding the prime implicants. In finding the prime implicants, an N node is used as follows. First, all the N nodes in each of the spaces are set to 1. Then all the prime implicants covering 1's in each of the spaces are found. Second, all the N nodes in each of the spaces are set to 0. Then all the prime implicants covering 0's in each of the spaces are found. Since an N represents a combination which will never be applied it is allowed to assume a value that could potentially cause a short circuit.

As can be seen in Appendix B, only a single line of code in the initialization of the global variables is changed in order to process the N modes. The "empty_cover.cov" vector is initialized to 1 for each N node. By initializing all the N nodes as covered, the greedy selection algorithm thinks it has covered all the nodes as soon as it has picked just enough prime implicants to cover all the non-N nodes.

A number of changes are also required in order to implement the X type "don't care" conditions. Given i nodes of type X in the input truth table, $2^i$ truth tables are generated in which all possible combinations of assignments of 1 and 0 values to the X nodes are represented. For an example, see FIG. 11. Each of the $2^i$ truth tables in FIG. 11 is separately run through the mixed gate generation algorithm. The truth table which produces the cheapest mixed gate is taken an the solution for the original truth table which contains X nodes.

APPENDIX A

```
/* declare global variables */
best_transistor_count, num_nodes_to_cover of type integer;
best_covers of type list;
empty_cover of type COVER;

/* initialize variables */
best_transistor_count = ∞;
best_covers = ();/* best_covers will contain all equally efficient */
                 /* mixed gates to implement function */
num_nodes_to_cover = total number of input combinations to cover,
                     which is $2^n$ for an n input function;
```

```
empty_cover.nprimes = ();
empty_cover.pprimes = ();
empty_cover.cov = a vector of 2^n zeros;

/* call greedy cover selector */
greedy_select(empty_cover);
greedy_select(cover)
        cover of type COVER;
{

/* declare local variables */
        best_efficiency, trans_count, efficiency of type integer;
        best_partial_covers of type list;
        prime of type PRIME;
        partial_cover, partial of type COVER;

/* initialize variables */
        best_partial_covers = ();  /* list of most efficient partial */
                                   /* covers to recurse on */
        best_efficiency = 0;

/* loop over all PI's not already in cover */
        For each prime whose prime.nexpr is not in cover.nprimes
        and whose prime.pexpr is not in cover.pprimes do:
        {
                /* combine evaluates to a new partial cover which */
                /* combines cover and prime, see definition */
                partial_cover = combine(cover, prime);
                num_nodes_cov = number of 1's in partial_cover.cov;
                /* first make sure that prime isn't */
                /* contained in cover */
                if (num_nodes_cov == number of 1's in cover.cov)
                        skip; /* goto top of loop */
                /* make sure that cover isn't */
                /* contained in prime */
                if (num_nodes_cov == number of 1's in prime.cov)
                        skip;

/* get_tran_count evaluates to number of */
                /* transistors needed to implement */
                /* partial_cover.nfact and partial_cover.pfact, */
                /* see definition */
                trans_count = get_tran_count(partial_cover);
                efficiency = num_nodes_cov / trans_count;

/* see if this search path can be bound */
                if ( (trans_count > best_transistor_count) ||
                        ((trans_count == best_transistor_count) &&
                                (num_nodes_cov < num_nodes_to_cover))) skip;
```

```
/* see if we have a just-as-good complete cover */
if ( (trans_count == best_transistor_count) &&
     (num_nodes_cov == num_nodes_to_cover))
  { best_covers = best_covers list with partial_cover
                              appended to it;
    /* a partial cover must also be better than */
    /* the complete covers */
    if ( efficiency > best_efficiency )
      { best_efficiency = efficiency;
        best_partial_covers = (); }
    skip; }

/* see if we have a better complete cover */
if ( (trans_count < best_transistor_count) &&
     (num_nodes_cov == num_nodes_to_cov))
  { best_covers = ();  /* flush complete covers */
    best_covers = best_covers list with partial_cover
                              appended to it;
    best_transistor_count = trans_count;
    /* a partial cover must also be better than */
    /* the complete covers */
    if ( efficiency > best_efficiency )
      { best_efficiency = efficiency;
        best_partial_covers = (); }
    skip; }

/* Otherwise, we have a partial cover with less */
/* transistors than the best complete cover to */
/* date, so we must see if it is among the best */
/* partial covers */

/* see if just-as-good partial cover */
if (efficiency == best_efficiency)
  { best_partial_covers = best_partial_covers list with
                              partial_cover appended to it;
    skip; }

/* see if we have a new best partial cover */
if (efficiency > best_efficiency)
  { best_efficiency = efficiency;
    best_partial_covers = ();
    best_partial_covers = best_partial_covers list with
                              partial_cover appended to it;
    skip; }

} /* end loop */
```

```
/* recurse on all the equally promising partial covers */
For each partial in best_partial_covers do:
        greedy_select(partial);

} /* end greedy_select */ combine(cover, prime) evaluates to type COVER
        cover of type COVER;
        prime of type PRIME;
{
        /* declare local variables */
        new_cover of type COVER;
        constant_space_vec of type vector of $2^n$ bits;
        polarity_vec of type vector of $2^n$ integers;
        i of type integer;

new_cover.cov = bitwise OR of cover.cov with prime.cov;
        if (the vectors new_cover.cov and cover.cov are the same)
                /* prime is contained in cover */
                return( new_cover );
        if (the vectors new_cover.cov and prime.cov are the same)
                /* cover is contained in prime */
                return( new_cover );
        /* otherwise we know that prime adds to cover */
        new_cover.nprimes = cover.nprimes;
        new_cover.pprimes = cover.pprimes;

/* now we must determine if prime adds to cover's */
        /* N network, P network, or both */
        if(prime only has an N pass expression)
            new_cover.nprimes = prime.nexpr appended to cover.nprimes;
        else if(prime only has a P pass expression)
            new_cover.pprimes = prime.pexpr appended to cover.pprimes;
        else
        {
            /* see if prime covers both 0 and 1 nodes */
            /* in CONSTANT_SPACE */
            constant_space_vec = CONSTANT_SPACE encoded as vector;
            For i from 0 to $2^n - 1$ do:
                { if ( (cover.cov[i] == 0) && (prime.cov[i] == 1) )
                      if (constant_space_vec[i] == 0)
                          polarity_vec[i] = 0;
                      else
                          polarity_vec[i] = 1;
                  else
                      polarity_vec[i] = 2;
                } /* end For */
```

```
        if (polarity_vec contains a 0)
            new_cover.nprimes = prime.nexpr appended to cover.nprimes;
        if (polarity_vec contains a 1)
            new_cover.pprimes = prime.pexpr appended to cover.pprimes;
    } /* end else */ new_cover.nfact = minimization of new_cover.nprimes using
                      method outlined in section 2.5.4;
    new_cover.pfact = minimization of new_cover.pprimes using
                      method outlined in section 2.5.4;

return( new_cover );

} /* end combine */ get_tran_count(cover) evaluates to type integer
    cover of type COVER;
{
    /* declare local variables */
    inv_steer_ctrls of type set;
    n_half_invs of type set;
    p_half_invs of type set;
    num_invs_steer, num_steer_lits of type integer;
    num_half_invs of type integer;

/* number of steering transistors */
    num_steer_lits = number of literals appearing in all the boolean
                     expressions of both cover.nfact and cover.pfact;
    /* number of inverters needed to control steering */
    inv_steer_ctrls = { x | x' is a literal in a boolean expression
                            in cover.nfact or cover.pfact, or both };
    num_invs_steer = size of inv_steer_ctrls;
    /* number of half-inverters for pass variables */
    n_half_invs = { x | x' is a pass variable in cover.nfact
                        and x ∉ inv_steer_ctrls };
    p_half_invs = { x | x' is a pass variable in cover.pfact
                        and x ∉ inv_steer_ctrls };
    num_half_invs = size of n_half_invs + size of p_half_invs;

return( num_steer_lits + (num_invs_steer x2) +
            num_half_invs );

}
```

APPENDIX B

```
/* declare global variables */
best_transistor_count, num_nodes_to_cover of type integer;
best_covers of type list;
empty_cover of type COVER;

/* initialize variables */
best_transistor_count = ∞;
best_covers = ();     /* best_covers will contain all equally efficient */
                      /* mixed gates to implement function */
num_nodes_to_cover = total number of input combinations to cover,
                    which is 2ⁿ for an n input function;
empty_cover.nprimes = ();
empty_cover.pprimes = ();
empty_cover.cov = a vector of 2ⁿ zeros, except that each N node
                  is set to 1;

/* call greedy cover selector */
greedy_select(empty_cover);
```

While the invention has been particularly shown and described with reference to preferred embodiments thereof, it will be understood by those skilled in the art that various changes in form and details may be made without departing from the spirit and scope of the invention as defined in the following claims.

I claim:

1. In a data processing system having at least one processor and a memory, a method for generating a schematic description of an integrated circuit, said circuit including both pass and restoring logic networks, comprising the processor performing the steps of:
   a) accepting inputs and corresponding outputs for a function to be performed by the integrated circuit;
   b) generating, and storing in memory, data structures comprised of multidimensional spaces for representing the inputs and the outputs and storing a representation of the inputs and the outputs in the data structures, said data structures including data structures that view the inputs as pass values and a data structure that views the inputs as only control variables;
   c) finding prime implicants of the representation held in data structures and using prime implicants of the representations held in the data structures that view the inputs as pass variables to represent pass logic networks, and using prime implicants from the data structures that view the inputs only as control variables to represent restoring logic networks;
   d) selecting certain of the pass and restoring logic prime implicants using an optimization procedure to generate a cover of the function; and
   e) producing the schematic description of the integrated circuit by generating pass and restoring logic networks for the selected prime implicants.

2. A data processing method as claimed in claim 1 wherein in the step of selecting, prime implicants that are in a data structure that view an input as a pass variable, and that do not span alternate values of the input viewed as a pass variable, are excluded from being selected.

3. A data processing method as recited in claim 1 wherein the data structures have a dimension for each input.

4. A data processing method as recited in claim 3 wherein the multidimensional spaces that comprise data structures have a plurality of vertices.

5. A data processing method as recited in claim 4 wherein coordinates of the vertices are values of the inputs.

6. A data processing method as recited in claim 4 wherein for the data structures that view the inputs only as control variables, each vertex has a value of an output of the function produced for inputs that comprise coordinates of the vertex.

7. A data processing method as recited in claim 4 wherein for each of the data structures that view an input as a pass variable, the vertices each have a value of one if the output of the function is equal to the input and a value of zero if the output of the function is not equal to the input.

8. A data processing method as recited in claim 1 wherein the inputs and outputs are provided in a truth table format.

* * * * *